United States Patent
Inazuki et al.

(10) Patent No.: US 10,747,098 B2
(45) Date of Patent: *Aug. 18, 2020

(54) HALFTONE PHASE SHIFT PHOTOMASK BLANK

(71) Applicant: Shin-Etsu Chemical Co., Ltd., Tokyo (JP)

(72) Inventors: Yukio Inazuki, Joetsu (JP); Souichi Fukaya, Echizen (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 128 days.

This patent is subject to a terminal disclaimer.

(21) Appl. No.: 15/902,033

(22) Filed: Feb. 22, 2018

(65) Prior Publication Data

US 2018/0259842 A1    Sep. 13, 2018

(30) Foreign Application Priority Data

Mar. 10, 2017  (JP) .................. 2017-046066

(51) Int. Cl.
*G03F 1/32* (2012.01)
*G03F 1/58* (2012.01)
*G03F 1/80* (2012.01)

(52) U.S. Cl.
CPC .......... *G03F 1/32* (2013.01); *G03F 1/58* (2013.01); *G03F 1/80* (2013.01)

(58) Field of Classification Search
CPC .......... G03F 1/32; G03F 1/58; G03F 1/80
See application file for complete search history.

(56) References Cited

U.S. PATENT DOCUMENTS

| 5,474,864 A | 12/1995 | Isao et al. |
| 2007/0212618 A1* | 9/2007 | Yoshikawa ............ G03F 1/32 430/5 |
| 2007/0248897 A1* | 10/2007 | Yoshikawa ............ G03F 1/32 430/5 |
| 2009/0075185 A1* | 3/2009 | Okubo .................. G03F 1/54 430/5 |

(Continued)

FOREIGN PATENT DOCUMENTS

| EP | 1 832 925 A2 | 9/2007 |
| EP | 1 847 874 A2 | 10/2007 |

(Continued)

OTHER PUBLICATIONS

European Search Report for Appl. No. 18156698.5 dated Jul. 24, 2018.

(Continued)

*Primary Examiner* — Martin J Angebranndt
(74) *Attorney, Agent, or Firm* — Birch, Stewart, Kolasch & Birch, LLP

(57) ABSTRACT

A halftone phase shift photomask blank has on a transparent substrate, a first film serving as a halftone phase shift film, a second film serving as a light shielding film, a third film serving as a hard mask film, and a fourth film. The first and third films are formed of silicon-containing materials which are resistant to chlorine base dry etching and removable by fluorine base dry etching. The second and fourth films are formed of silicon-free, chromium-containing materials which are resistant to fluorine base dry etching and removable by chlorine base dry etching.

6 Claims, 7 Drawing Sheets

(56) References Cited

U.S. PATENT DOCUMENTS

| | | |
|---|---|---|
| 2016/0187769 A1 | 6/2016 | Nozawa et al. |
| 2016/0291451 A1 | 10/2016 | Nam et al. |
| 2016/0291455 A1 | 10/2016 | Kosaka |
| 2016/0377975 A1 | 12/2016 | Matsumoto et al. |
| 2017/0123305 A1* | 5/2017 | Watanabe ................. G03F 1/54 |
| 2018/0259843 A1* | 9/2018 | Fukaya .................... G03F 1/50 |

FOREIGN PATENT DOCUMENTS

| | | |
|---|---|---|
| JP | 7-140635 A | 6/1995 |
| JP | 2015-191885 A | 11/2016 |

OTHER PUBLICATIONS

Japanese Office Action, dated Oct. 8, 2019, for Japanese Application No. 2017-046066, with an English translation.

* cited by examiner

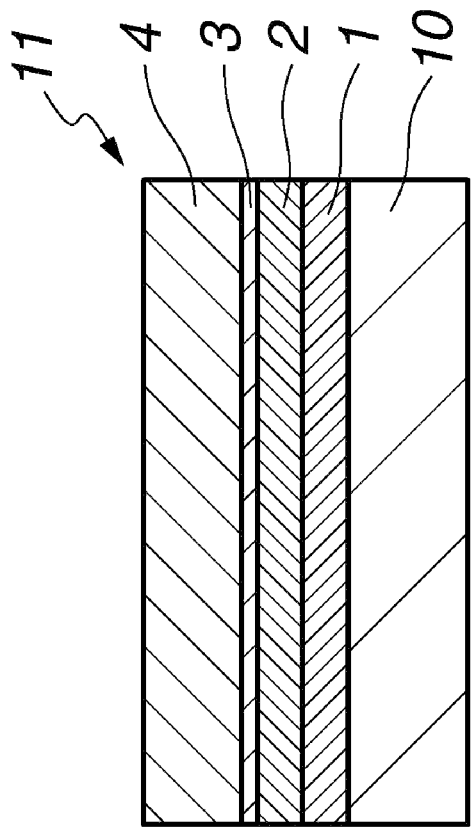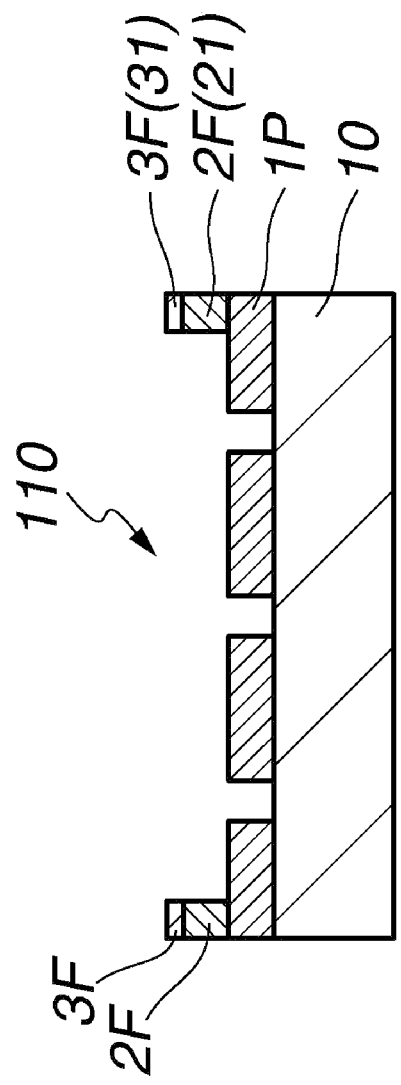

HALFTONE PHASE SHIFT PHOTOMASK BLANK

CROSS-REFERENCE TO RELATED APPLICATION

This non-provisional application claims priority under 35 U.S.C. § 119(a) on Patent Application No. 2017-046066 filed in Japan on Mar. 10, 2017, the entire contents of which are hereby incorporated by reference.

TECHNICAL FIELD

This invention relates to a halftone phase shift photomask blank which is processed into a halftone phase shift photomask for use in the microfabrication of semiconductor integrated circuits or the like.

BACKGROUND ART

In the field of semiconductor technology, research and development efforts are continued for further miniaturization of pattern features. Recently, as advances including miniaturization of circuit patterns, thinning of interconnect patterns and miniaturization of contact hole patterns for connection between cell-constituting layers are in progress to comply with higher integration density of LSIs, there is an increasing demand for the micropatterning technology. Accordingly, in conjunction with the technology for manufacturing photomasks used in the exposure step of the photolithographic microfabrication process, it is desired to have a technique of forming a more fine and accurate circuit pattern or mask pattern.

In general, reduction projection is employed when patterns are formed on semiconductor substrates by photolithography. Thus the size of pattern features formed on a photomask is about 4 times the size of pattern features formed on a semiconductor substrate. In the current photolithography technology, the size of circuit patterns printed is significantly smaller than the wavelength of light used for exposure. Therefore, if a photomask pattern is formed simply by multiplying the size of circuit pattern 4 times, the desired pattern is not transferred to a resist film on a semiconductor substrate due to optical interference and other effects during exposure.

Sometimes, optical interference and other effects during exposure are mitigated by forming the pattern on a photomask to a more complex shape than the actual circuit pattern. Such a complex pattern shape may be designed, for example, by incorporating optical proximity correction (OPC) into the actual circuit pattern. Also, attempts are made to apply the resolution enhancement technology (RET) such as modified illumination, immersion lithography or double exposure (or double patterning) lithography, to meet the demand for miniaturization and higher accuracy of patterns.

The phase shift method is used as one of the RET. The phase shift method is by forming a pattern of film capable of phase reversal of approximately 180 degrees on a photomask, such that contrast may be improved by utilizing optical interference. One of the photomasks adapted for the phase shift method is a halftone phase shift photomask. Typically, the halftone phase shift photomask includes a substrate of quartz or similar material which is transparent to exposure light, and a photomask pattern of halftone phase shift film formed on the substrate, capable of providing a phase shift of approximately 180 degrees between exposure light transmitted by a transparent section where no phase shift film is formed and exposure light transmitted by a (phase shift) section where the phase shift film is formed and having an insufficient transmittance to contribute to pattern formation. As the halftone phase shift photomask, there were proposed photomasks having a halftone phase shift film of molybdenum silicide oxide (MoSiO) or molybdenum silicide oxynitride (MoSiON) as disclosed in Patent Document 1, and photomasks having a halftone phase shift film of SiN or SiON.

There is a demand for further miniaturization of the mask pattern necessary for pattern transfer. For the purpose of enhancing resolution, a halftone phase shift photomask blank having a hard mask film deposited thereon is used because the hard mask film makes it possible to reduce the thickness of a resist film which is used for patterning in the processing of the photomask blank into a photomask. The hard mask film which is applied to the halftone phase shift photomask blank generally has a three-layer structure including a halftone phase shift film of a molybdenum silicon compound or silicon compound, a light shielding film containing chromium, and a hard mask film containing silicon deposited in order from the transparent substrate side.

CITATION LIST

Patent Document 1: JP-A H07-140635

SUMMARY OF INVENTION

While the halftone phase shift photomask includes a photomask pattern-bearing region serving for pattern transfer, an outer frame pattern for shielding exposure light must be formed outside the photomask pattern-bearing region, that is, at the outer periphery of the halftone phase shift photomask. Since the outer frame pattern must have a degree of light shielding enough to substantially shield exposure light, the film used for this purpose must have a substantial thickness. If the light shielding film used for formation of a photomask pattern is made thick so that the light shielding film may also serve as the film for outer frame pattern, then the problem that it is difficult to form a fine pattern in the light shielding film arises although the degree of light shielding in the outer frame region is ensured.

When a thick film is etched using a resist film as mask, the resist film must be thick. However, it is difficult to form a fine resist pattern from the thick resist film. When a thick chromium base film is subjected to chlorine base dry etching with an etchant gas containing chlorine gas and oxygen gas, through the pattern of chemically amplified resist as the etching mask, the etched film loses linearity on chlorine base dry etching.

In one method for forming a fine pattern by chlorine base dry etching without increasing the thickness of resist film, a hard mask film which is resistant to chlorine base dry etching is used. If the pattern of this hard mask film is used as an etching mask, the photomask pattern and outer frame pattern can be simultaneously formed. In this case, resist patterns corresponding to both the photomask pattern and the outer frame pattern are formed at the same time from the resist film deposited on the hard mask film. If negative resist is used, undesirably imaging of the resist pattern is time consuming.

Referring to FIGS. 6 and 7, a process involving the steps of forming a photomask pattern and then forming an outer frame pattern is described. First, there is furnished a photomask blank 9 including a phase shift film 6, a light shielding film 7 and a hard mask film 8 deposited in order on a transparent substrate 10, as shown in FIG. 6A. A first resist film 51 is coated onto the hard mask film 8 of the blank 9 (FIG. 6B). A first resist pattern 511 is formed from the first resist film 51 (FIG. 6C). With the first resist pattern 511 made etching mask, fluorine base dry etching is carried out to pattern the hard mask film 8 into a hard mask film pattern 81 (FIG. 6D). Then the first resist pattern 511 is removed (FIG. 6E). With the hard mask film pattern 81 made etching mask, chlorine base dry etching is carried out to pattern the light shielding film 7 into a light shielding film pattern 71 (FIG. 6F).

Next, fluorine base dry etching is carried out to remove the hard mask film pattern 81, and with the light shielding film pattern 71 made etching mask, the phase shift film 6 is patterned to form a phase shift film pattern 61 (FIG. 7A). A second resist film 52 is newly coated on the light shielding film pattern 71 and the bared substrate 10 (FIG. 7B). A second resist pattern 521 is formed from the second resist film 52 (FIG. 7C). With the second resist pattern 521 made etching mask, chlorine base dry etching is carried out to pattern the light shielding film pattern 71 to form an outer frame pattern 711 of light shielding film (FIG. 7D). Finally the second resist pattern 521 is removed, yielding a photomask 91 (FIG. 7E). When the photomask having the outer frame pattern 711 of light shielding film is prepared in this way, the second resist film 52 is formed in the recess of the photomask pattern as well, indicating a possibility that after removal of the second resist film 52, resist residues are left in the recess of the photomask pattern. This can cause defects to the photomask.

In the photolithography, a light source of shorter wavelength is used for obtaining a finer image. In the practical processing technology on the currently most advanced level, the exposure light source has made a transition from KrF excimer laser light (248 nm) to ArF excimer laser light (193 nm). It is found that if ArF excimer laser light of higher energy is used, the mask can be given damages which are not found with KrF excimer laser light. One problem is that during continuous use of the photomask, defects in the form of foreign particles are generated on the photomask. On analysis of these defects, chromium is detected in some cases. This is because chromium used in the light shielding film migrates during laser light irradiation.

In the halftone phase shift photomask, an outer frame pattern for shielding exposure light must be formed outside a region where a photomask pattern (phase shift film pattern) is formed, which is a region for pattern transfer, that is, at the outer periphery of the halftone phase shift photomask. In the photomask pattern region, a light-shielding portion is included sometimes. Since the outer frame pattern and the light-shielding portion in the photomask pattern region should have a degree of light shielding enough to substantially shield exposure light, these portions are typically formed of a chromium-containing light shielding film.

Commonly used is a halftone phase shift photomask blank including a transparent substrate and a two-layer film including a halftone phase shift film and a chromium-containing light shielding film deposited in order on the substrate. When a halftone phase shift photomask is prepared from this photomask blank, the surface of the chromium-containing film is exposed where light shielding is necessary. Also used is a halftone phase shift photomask blank including a transparent substrate and a three-layer film including a halftone phase shift film, a chromium-containing light shielding film, and a silicon-containing hard mask film. When a halftone phase shift photomask is prepared from this photomask blank having the hard mask film, the surface of the chromium-containing film is exposed where light shielding is necessary, because the hard mask film is finally removed. If the surface of the chromium-containing film is exposed on the halftone phase shift photomask, there is a likelihood of chromium migration upon irradiation of ArF excimer laser light. During continuous use of the halftone phase shift photomask, defects in the form of foreign particles will generate.

An object of the invention is to provide a halftone phase shift photomask blank having deposited thereon a hard mask film from which a finer size pattern can be formed by applying a thinner resist film, such that a halftone phase shift photomask may be prepared from the blank at a high accuracy and with a minimized possibility of defect generation, while a silicon-containing film is left on a chromium-containing film (formed for ensuring a high degree of light shielding) via a simple pattern forming step, at the outer periphery of the photomask whereby the surface of the chromium-containing film is not exposed outside.

The inventors have found that a halftone phase shift photomask blank is constructed as comprising a transparent substrate, a first film serving as a halftone phase shift film on the substrate, a second film formed contiguous to the first film, a third film formed contiguous to the second film, and a fourth film formed contiguous to the third film, wherein the first and third films are formed of silicon-containing materials which are resistant to chlorine base dry etching and removable by fluorine base dry etching, the second and fourth films are formed of silicon-free, chromium-containing materials which are resistant to fluorine base dry etching and removable by chlorine base dry etching; that a halftone phase shift photomask may be prepared from the blank (having the hard mask film) at a high accuracy and with a minimized possibility of defect generation, while a silicon-containing film is left on a chromium-containing film (formed for providing a high degree of light shielding) via a simple pattern forming step, at the outer periphery of the photomask; and that in the resulting halftone phase shift photomask, the surface of the chromium-containing film is not exposed at the top thereof.

In one aspect, the invention provides a halftone phase shift photomask blank comprising a transparent substrate, a first film serving as a halftone phase shift film on the substrate, a second film serving as a light shielding film formed contiguous to the first film, a third film serving as a hard mask film formed contiguous to the second film, and a fourth film formed contiguous to the third film. The first and third films are formed of silicon-containing materials which are resistant to chlorine base dry etching and removable by fluorine base dry etching. The second and fourth films are formed of silicon-free, chromium-containing materials which are resistant to fluorine base dry etching and removable by chlorine base dry etching.

Preferably, the second film has a sheet resistance of up to $10,000\Omega/\square$; the third film has a thickness of 1 to 20 nm; the third film is thinner than the second film; the fourth film has a thickness of 30 to 120 nm; the first, second and third films have a total optical density of at least 2 relative to exposure light.

In a preferred embodiment, the second and fourth films are constructed such that an etching clear time of the fourth film on chlorine base dry etching under one set of conditions is longer than an etching clear time of the second film on chlorine base dry etching under the one set of conditions.

Advantageous Effects of Invention

From the halftone phase shift photomask blank of the invention, a halftone phase shift photomask may be prepared at a high accuracy and with a minimized possibility of defect generation. A silicon-containing film is left on a chromium-containing film (formed for providing a high degree of light shielding) via a simple pattern forming step, at the outer periphery of the photomask. In the photomask, the surface of the chromium-containing film is not exposed outside. There is a little likelihood of chromium migration upon irradiation of ArF excimer laser light.

BRIEF DESCRIPTION OF DRAWINGS

FIG. 1A is a cross-sectional view of one exemplary halftone phase shift photomask blank of the invention. FIG. 1B is a cross-sectional view of one exemplary halftone phase shift photomask obtained therefrom.

DESCRIPTION OF PREFERRED EMBODIMENTS

Figure 2A:
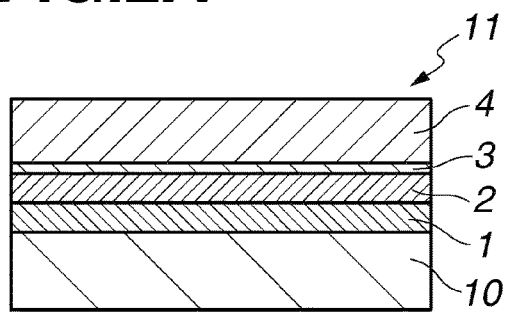
FIGS. 2A to 2F illustrate in cross-sectional view successive steps of an exemplary method (I) for preparing a halftone phase shift photomask from a halftone phase shift photomask blank of the invention.
Figure 2D:
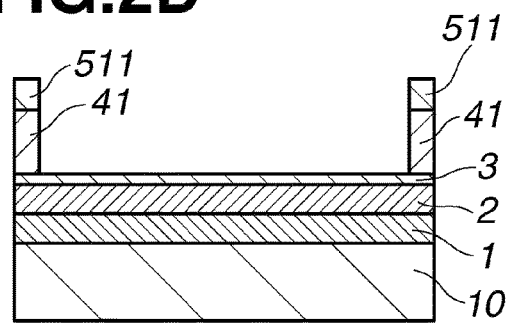
Figure 2B:
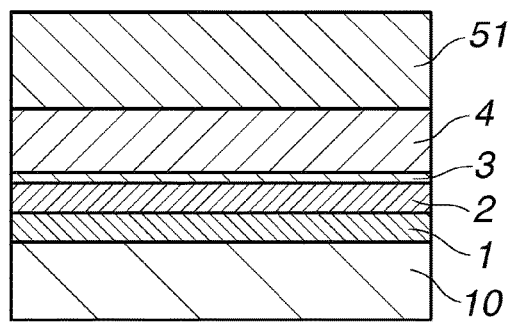
Figure 2E:
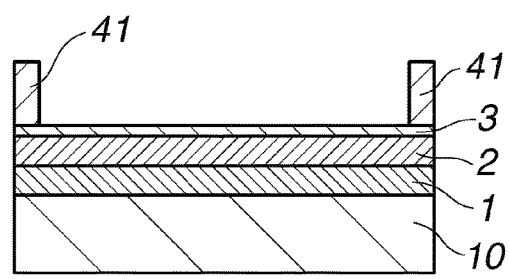
Figure 2C:
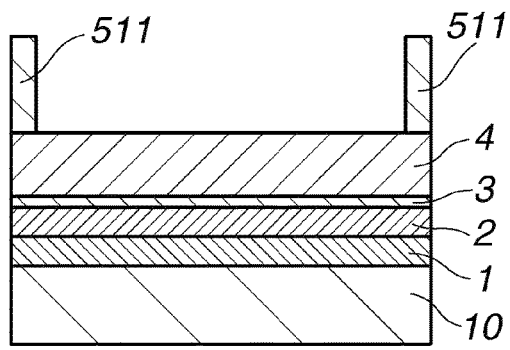
Figure 2F:
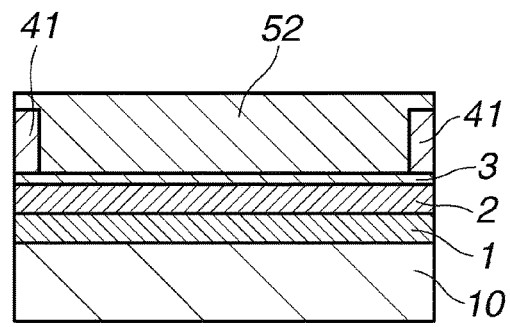

The invention provides a halftone phase shift photomask blank comprising a transparent substrate (i.e., a substrate transparent to exposure light) such as a quartz substrate and a plurality of films deposited thereon. The plurality of films are first, second, third, and fourth films. The first film serving as a halftone phase shift film is formed on the substrate; the second film is formed contiguous to the first film; the third film is formed contiguous to the second film; the fourth film is formed contiguous to the third film. Each of the first, second, third and fourth films may be constructed by a single layer or a plurality of layers (two or more layers, typically 2 to 5 layers) meeting the etching properties defined below.

FIG. 1A is a cross-sectional view of a halftone phase shift photomask blank in one embodiment of the invention. The photomask blank depicted at 11 in FIG. 1A includes a transparent substrate 10, a first film 1 deposited contiguous to the substrate 10, a second film 2 deposited contiguous to the first film 1, a third film 3 deposited contiguous to the second film 2, and a fourth film 4 deposited contiguous to the third film 3.

The first and third films are formed of materials which are resistant to chlorine base dry etching and removable by fluorine base dry etching. On the other hand, the second and fourth films are formed of materials which are resistant to fluorine base dry etching and removable by chlorine base dry etching. Namely, the first, second, third and fourth films are constructed such that any two adjacent films may have different etching properties, the second film may function as an etching mask (hard mask) for the adjoining first film on the substrate side, the third film may function as an etching mask (hard mask) for the adjoining second film on the substrate side, and the fourth film may function as an etching mask (hard mask) for the adjoining third film on the substrate side. As used herein, the term "chlorine base dry etching" refers to dry etching using as etchant a gas mixture of oxygen gas ($O_2$) and chlorine gas ($Cl_2$), optionally in admixture with a rare gas such as argon gas (Ar) or helium gas (He), namely oxygen-containing chlorine base dry etching. The term "fluorine base dry etching" refers to dry etching using as etchant a fluoride gas such as sulfur hexafluoride gas ($SF_6$) or carbon tetrafluoride gas ($CF_4$), optionally in admixture with oxygen gas ($O_2$) and a rare gas such as argon gas (Ar) or helium gas (He).

While the second and fourth films have like etching properties, these films may be constructed such that an etching clear time of the fourth film on chlorine base dry etching under one set of conditions is longer than an etching clear time of the second film on chlorine base dry etching under the one set of conditions (for chlorine base dry etching of the fourth film), or equal to an etching clear time of the second film on chlorine base dry etching under the one set of conditions, or shorter than an etching clear time of the second film on chlorine base dry etching under the one set of conditions. As used herein, the term "etching clear time" refers to a time passed from the start of etching until complete removal of the film and is generally given as a film thickness (nm) divided by an etching rate (nm/sec).

According to the invention, the fourth film is deposited in addition to the first, second and third films. The fourth film is used to form a mask pattern first. That is, a mask pattern of the fourth film for forming an outer frame pattern of the third film or an outer frame pattern of the second film can be formed before a mask pattern of the second film is formed using a mask pattern of the third film, and before a mask pattern of the first film is formed using a mask pattern of the second film. Now that the fourth film is used to form a mask pattern first, the step of depositing a resist film in a photomask pattern-forming region after formation of a photomask pattern of the first film and forming a resist pattern therefrom becomes unnecessary. This avoids the problem that after removal of the resist pattern, resist residues are left in recesses of the photomask pattern, causing defects.

The preferred embodiment, wherein the second and fourth films are constructed such that the etching clear time of the fourth film is longer than the etching clear time of the second film during chlorine base dry etching under the same set of conditions, ensures that even though the fourth film is exposed to chlorine base dry etching while the mask pattern of the third film is used to form a mask pattern of the second film, the fourth film can be retained after formation of the mask pattern of the second film, and that the fourth film can be retained where an outer frame pattern of the third film is to be formed, for protecting the third film, while the mask pattern of the second film is used to form a mask pattern of the first film. As a result, the third film can be retained as the outer frame pattern.

In the embodiment wherein the etching clear time of the fourth film is longer than the etching clear time of the second film, a ratio of the etching clear time of the fourth film to the etching clear time of the second film is more than 1, preferably at least 1.5, more preferably at least 2, and preferably up to 5, more preferably up to 4. In the other embodiment wherein the etching clear time of the fourth film is equal to or shorter than the etching clear time of the second film, a ratio of the etching clear time of the fourth film to the etching clear time of the second film is equal to or less than 1, preferably up to 0.9, more preferably up to 0.8, and preferably at least 0.3, more preferably at least 0.5. Where the second and fourth films are formed of the same material, a ratio of etching clear time is equal to a ratio of film thickness. Where the second and fourth films are formed of different materials and hence, have different etching rates, a ratio of etching clear time is set after their etching clear times are computed from their film thicknesses and etching rates.

The first film serving as a halftone phase shift film is formed of a material which is resistant to chlorine base dry etching and removable by fluorine base dry etching. For this requirement, silicon-containing materials are adequate. Suitable silicon-containing materials include silicon compounds containing silicon and at least one element selected from oxygen, nitrogen and carbon, such as silicon oxide (SiO), silicon nitride (SiN), and silicon oxynitride (SiON); and transition metal/silicon compounds containing transition metal (Me), silicon and at least one element selected from oxygen, nitrogen and carbon, such as transition metal/silicon oxide (MeSiO), transition metal/silicon nitride (MeSiN), transition metal/silicon carbide (MeSiC), transition metal/silicon oxynitride (MeSiON), transition metal/silicon oxycarbide (MeSiOC), transition metal/silicon nitride carbide (MeSiNC), and transition metal/silicon oxide nitride carbide (MeSiONC). Examples of the transition metal (Me) include titanium (Ti), vanadium (V), cobalt (Co), nickel (Ni), zirconium (Zr), niobium (Nb), molybdenum (Mo), hafnium (Hf), tantalum (Ta), and tungsten (W), with molybdenum (Mo) being preferred for dry etching amenability. Preferably the silicon-containing materials are free of chromium (Cr).

The phase shift of the halftone phase shift film with respect to exposure light is such that a phase shift between the exposure light transmitted by a region of phase shift film (phase shift region) and the exposure light transmitted by a neighboring region where the phase shift film is removed, causes interference of exposure light at the boundary whereby contrast is increased. Specifically the phase shift is 150 to 200 degrees. Although ordinary halftone phase shift films are set to a phase shift of approximately 180°, it is possible from the standpoint of contrast enhancement to adjust the phase shift below or beyond 180°. For example, a phase shift of smaller than 180° is effective for forming a thinner film. It is a matter of course that a phase shift closer to 180° is more effective because a higher contrast is available. In this regard, the phase shift is preferably 160 to 190°, more preferably 175 to 185°, and most preferably approximately 180°. The halftone phase shift film has a transmittance of exposure light which is preferably at least 3%, more preferably at least 5%, and up to 30%.

Where the silicon-containing material of which the first film serving as a phase shift film, typically halftone phase shift film is formed is a silicon compound, the silicon content is preferably at least 30 at %, more preferably at least 40 at % and up to 80 at %, more preferably up to 60 at %. The oxygen content is preferably at least 0 at % and up to 60 at %, more preferably up to 20 at %. The nitrogen content is preferably at least 10 at %, more preferably at least 30 at % and up to 65 at %, more preferably up to 60 at %. Where the silicon-containing material is a transition metal/silicon compound, the transition metal (Me) content is preferably at least 0.1 at %, more preferably at least 1 at % and up to 30 at %, more preferably up to 20 at %. The silicon content is preferably at least 25 at %, more preferably at least 30 at % and up to 80 at %, more preferably up to 60 at %. The oxygen content is preferably at least 0 at %, more preferably at least 5 at % and up to 70 at %, more preferably up to 20 at %. The nitrogen content is preferably at least 10 at %, more preferably at least 25 at % and up to 60 at %, more preferably up to 57 at %. The carbon content is preferably up to 10 at %, more preferably up to 5 at %. The thickness of the phase shift film is preferably up to 80 nm, more preferably up to 70 nm, and even more preferably up to 65 nm, because a thinner film is easier to form a fine pattern. The lower limit of the thickness of the phase shift film is set in the range where the desired optical properties are obtained relative to exposure light of wavelength up to 200 nm, typically ArF excimer laser light (193 nm). Most often the film thickness is set at least 40 nm, though not critical.

The second film is formed of a material which is resistant to fluorine base dry etching and removable by chlorine base dry etching. For this requirement, chromium-containing materials are adequate. Suitable chromium-containing materials include chromium, chromium compounds containing chromium and at least one element selected from oxygen, nitrogen and carbon, such as chromium oxide (CrO), chromium nitride (CrN), chromium carbide (CrC), chromium oxynitride (CrON), chromium oxycarbide (CrOC), chromium nitride carbide (CrNC), and chromium oxide nitride carbide (CrONC). The chromium-containing materials may further contain tin (Sn), indium (In) or the like, but are preferably free of silicon. The thickness of the second film is preferably at least 1 nm, more preferably at least 3 nm, even more preferably at least 40 nm and up to 100 nm, more preferably up to 70 nm.

The second film is preferably a light shielding film. Where the chromium-containing material of which the second film is formed is a chromium compound, the chromium content is preferably at least 30 at %, more preferably at least 35 at % and less than 100 at %, more preferably up to 99 at %, even more preferably up to 90 at %. The oxygen content is preferably at least 0 at % and up to 60 at %, more preferably up to 50 at %. Optical properties may be adjusted by incorporating oxygen, especially at least 1 at % of oxygen. The nitrogen content is preferably at least 0 at % and up to 50 at %, more preferably up to 40 at %. An etching rate may be adjusted by incorporating nitrogen, especially at least 1 at % of nitrogen. The carbon content is preferably at least 0 at % and up to 30 at %, more preferably up to 20 at %. An etching rate may be adjusted by incorporating carbon, especially at least 1 at % of carbon. The total content of chromium, oxygen, nitrogen and carbon is preferably at least 95 at %, more preferably at least 99 at %, and most preferably 100 at %. When the second film is a light shielding film, its thickness is preferably at least 15 nm, more preferably at least 30 nm, and up to 100 nm, more preferably up to 50 nm. The light shielding film may be a multilayer film, for example, including a light shielding layer and an antireflective layer.

While the outer frame pattern or a light shielding portion within a photomask pattern region in the halftone phase shift photomask should have a degree of light shielding enough to substantially shield exposure light, the second film in the form of a light shielding film provides the necessary degree of light shielding. The first and second films should preferably have a total optical density of at least 2, more preferably at least 2.5, and even more preferably at least 3 relative to exposure light of wavelength up to 200 nm, typically ArF excimer laser light (193 nm). A total optical density of up to 5 is preferred because a higher optical density requires an increase of film thickness.

The second film should preferably have a sheet resistance of up to 10,000 ohm/square (Ω/☐), for the reason that when an EB resist is formed on the third film, EB imaging is possible without charge build-up.

The third film is formed of a material which is resistant to chlorine base dry etching and removable by fluorine base dry etching. For this requirement, silicon-containing materials are adequate. Suitable silicon-containing materials include silicon alone; silicon compounds containing silicon and at least one element selected from oxygen, nitrogen and carbon, such as silicon oxide (SiO), silicon nitride (SiN), and silicon oxynitride (SiON); and transition metal/silicon compounds containing transition metal (Me), silicon and at least one element selected from oxygen, nitrogen and carbon, such as transition metal/silicon oxide (MeSiO), transition metal/silicon nitride (MeSiN), transition metal/silicon carbide (MeSiC), transition metal/silicon oxynitride (MeSiON), transition metal/silicon oxycarbide (MeSiOC), transition metal/silicon nitride carbide (MeSiNC), and transition metal/silicon oxide nitride carbide (MeSiONC). Examples of the transition metal (Me) include titanium (Ti), vanadium (V), cobalt (Co), nickel (Ni), zirconium (Zr), niobium (Nb), molybdenum (Mo), hafnium (Hf), tantalum (Ta), and tungsten (W), with molybdenum (Mo) being preferred for dry etching amenability. Preferably the silicon-containing materials are free of chromium (Cr). The thickness of the third film is preferably at least 1 nm, more preferably at least 2 nm, and up to 80 nm, more preferably up to 70 nm.

The third film is preferably a hard mask film. In particular, the third film is preferably a film which functions as a hard mask in pattern formation of a photomask pattern region, more preferably a film for improving the photomask pattern loading effect of etching. The third film is also preferably a film in which a pattern is directly formed from the resist pattern using the resist pattern as etching mask. Where the silicon-containing material of which the third film is formed is a silicon compound containing silicon and at least one element selected from oxygen and nitrogen or a transition metal/silicon compound containing transition metal (Me), silicon and at least one element selected from oxygen and nitrogen, the silicon content is preferably at least 20 at %, more preferably at least 33 at % and up to 95 at %, more preferably up to 80 at %. The oxygen content is preferably at least 0 at %, more preferably at least 20 at % and up to 70 at %, more preferably up to 66 at %. An oxygen content of at least 1 at % is preferable when an etching rate must be adjusted. The nitrogen content is preferably at least 0 at % and up to 50 at %, more preferably up to 40 at %. A nitrogen content of at least 1 at % is preferable when an etching rate must be adjusted. The content of transition metal is preferably at least 0 at % and up to 35 at %, more preferably up to 20 at %. When transition metal is contained, its content is preferably at least 1 at %. The total content of silicon, oxygen, nitrogen and transition metal is preferably at least 95 at %, more preferably at least 99 at %, and most preferably 100 at %. The third film is adequate as a hard mask for forming a photomask pattern in the photomask pattern-forming region. Where the third film is a hard mask film, it is preferred that the third film is thinner than the second film so that a thinner resist film capable of complying with finer pattern formation may be applied thereto. Specifically, the difference in thickness between the second film and the third film is preferably at least 30 nm, more preferably at least 35 nm; or the thickness of the third film is preferably up to ½, more preferably up to ⅓ of the thickness of the second film. Also where the third film is a hard mask film, its thickness is preferably at least 1 nm and up to 20 nm, more preferably at least 2 nm, even more preferably at least 4 nm, especially at least 8 nm, and up to 15 nm.

While the outer frame pattern in the halftone phase shift photomask should have a degree of light shielding enough to substantially shield exposure light, the first and second films alone, or the second film alone, optionally in combination with the third film, may provide the necessary degree of light shielding. In this case, the first, second and third films should preferably have a total optical density of at least 2, more preferably at least 2.5, and even more preferably at least 3 relative to exposure light of wavelength up to 200 nm, typically ArF excimer laser light (193 nm). A total optical density of up to 5 is preferred because a higher optical density requires an increase of film thickness.

The fourth film is formed of a material which is resistant to fluorine base dry etching and removable by chlorine base dry etching. For this requirement, adequate materials are as exemplified for the second film. Preferably the fourth film is formed of chromium alone or chromium compounds containing chromium and at least one element selected from oxygen, nitrogen and carbon. Where the chromium-containing material of which the fourth film is formed is a chromium compound, the chromium content is preferably at least 30 at %, more preferably at least 35 at % and less than 100 at %, more preferably up to 99 at %, even more preferably up to 90 at %. The oxygen content is preferably at least 0 at % and up to 60 at %, more preferably up to 40 at %. An etching rate may be adjusted by incorporating oxygen, especially at least 1 at % of oxygen. The nitrogen content is preferably at least 0 at % and up to 50 at %, more preferably up to 40 at %. An etching rate may be adjusted by incorporating nitrogen, especially at least 1 at % of nitrogen. The carbon content is preferably at least 0 at % and up to 30 at %, more preferably up to 20 at %. An etching rate may be adjusted by incorporating carbon, especially at least 1 at % of carbon. The total content of chromium, oxygen, nitrogen and carbon is preferably at least 95 at %, more preferably at least 99 at %, and most preferably 100 at %. The fourth film is adequate as a hard mask for forming an outer frame pattern. The thickness of the fourth film is preferably at least 30 nm and up to 120 nm, more preferably more than 30 nm, even more preferably at least 40 nm, especially at least 60 nm, and up to 100 nm, more preferably up to 90 nm.

The films in the halftone phase shift photomask blank may be deposited by the sputtering method. The method may be either DC sputtering or RF sputtering while any well-known techniques may be employed.

When a film of a material containing oxygen, nitrogen and carbon is deposited, reactive sputtering is preferred. The reactive sputtering method may use an inert gas and a reactive gas as the sputtering gas, specifically an inert gas such as helium gas (He), neon gas (Ne) or argon gas (Ar) and a reactive gas such as oxygen-containing gas, nitrogen-containing gas and/or carbon-containing gas, e.g., oxygen gas ($O_2$ gas), nitrogen oxide gas ($N_2O$ gas, $NO_2$ gas), nitrogen gas ($N_2$ gas), and/or carbon oxide gas (CO gas, $CO_2$ gas). Any of these gases may be combined so as to give the desired composition. Where the film is constructed by a plurality of layers, for example, where a film whose composition is graded stepwise or continuously in thickness direction is formed, for example, sputtering may be carried out while changing the composition of sputtering gas stepwise or continuously.

The pressure during sputter deposition may be selected as appropriate depending on the stress, chemical resistance and cleaning resistance of the film. The pressure is preferably at least 0.01 Pa, more preferably at least 0.03 Pa and up to 1 Pa, more preferably up to 0.3 Pa, because chemical resistance is improved in the range. The flow rates of gases may be selected so as to give the desired composition, typically in a range of 0.1 to 100 sccm. When the inert gas is used along with the reactive gas, the flow rate ratio of reactive gas to inert gas is preferably up to 5.0.

When the first and third films are formed of silicon-containing materials, they may be deposited by a sputtering method using as the target a silicon target, a silicon nitride target, a target containing both silicon and silicon nitride, a composite target containing silicon and transition metal, or a silicon-containing target and a transition metal target. On the other hand, when the second and fourth films are formed of chromium-containing materials, they may be deposited by a sputtering method using as the target a chromium target or a target containing chromium and at least one element selected from among oxygen, nitrogen and carbon. The power applied across the target may be selected as appropriate depending on the size of the target, cooling efficiency and ease of control of deposition. Typically the power per surface area of a target to be sputtered is 0.1 to 10 $W/cm^2$.

The halftone phase shift photomask blank constructed as above may be processed into a halftone phase shift photomask. In preparing a halftone phase shift photomask from the halftone phase shift photomask blank, any well-known methods may be used. For example, a film of chemically amplified photoresist, especially organic chemically amplified photoresist adapted for EB lithography is coated, a resist pattern is formed therefrom, and four films on the substrate are patterned in sequence by effecting either chlorine or fluorine base dry etching, depending on the etching properties of a film to be etched, while using as etching mask the resist pattern or a mask pattern formed from an overlying film in the photomask blank during the photomask preparation process.

From the halftone phase shift photomask blank of the invention, a halftone phase shift photomask having first, second and third films may be prepared. Specifically, from a halftone phase shift photomask blank 11 as shown in FIG. 1A, a halftone phase shift photomask 110 as shown in FIG. 1B is obtainable, the photomask 110 including a transparent substrate 10, a photomask pattern 1P of the first film, a mask pattern 21 of the second film such as an outer frame pattern 2F of the second film formed on the outer periphery of the substrate 10 contiguous to the first photomask pattern 1P, and a mask pattern 31 of the third film such as an outer frame pattern 3F of the third film formed contiguous to the second film mask pattern 21.

Figure 3A:
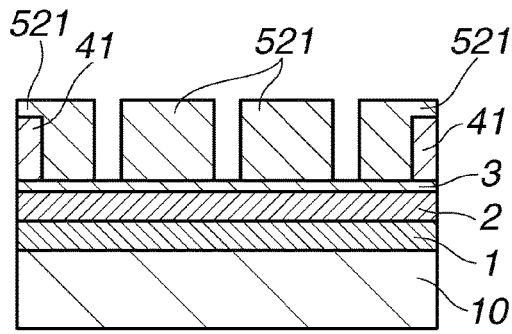
FIGS. 3A to 3E illustrate in cross-sectional view successive steps of method (I), following FIG. 2F.
Figure 3D:
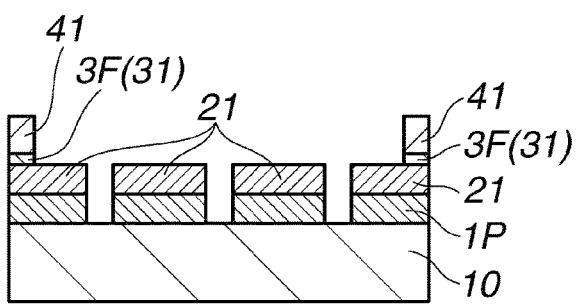
Figure 3B:
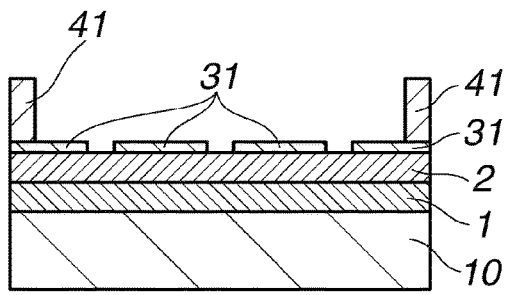
Figure 3E:
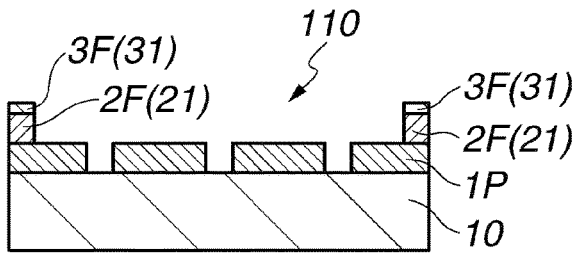

The halftone phase shift photomask 110 may be prepared by a method (I) comprising steps as shown in FIGS. 2 and 3, specifically step (1) of furnishing a halftone phase shift photomask blank 11 (FIG. 2A), step (2) of coating a first resist film 51 on the fourth film 4 (FIG. 2B), step (3) of processing the first resist film 51 to form a first resist pattern 511 in a portion where a mask pattern of the second film and a mask pattern of the third film are to be formed (FIG. 2C), step (4) of chlorine base dry etching, with the first resist pattern 511 made etching mask, a portion of the fourth film 4 which is not covered with the first resist pattern 511, to form a fourth film mask pattern 41 (FIG. 2D), step (5) of removing the first resist pattern 511 (FIG. 2E), step (6) of coating a second resist film 52 on the fourth film mask pattern 41 and the exposed portion of the third film 3 (FIG. 2F), step (7) of processing the second resist film 52 into a second resist pattern 521 in a portion where a photomask pattern is to be formed (FIG. 3A), step (8) of fluorine base dry etching, with the second resist pattern 521 made etching mask, a portion of the third film 3 which is not covered with the second resist pattern 521, to form a third film mask pattern 31 (FIG. 3B), step (9) of chlorine base dry etching, with the third film mask pattern 31 made etching mask, a portion of the second film 2 which is not covered with the third mask pattern 31, to form a mask pattern 21 of the second film 2 and if the fourth film mask pattern 41 is exposed, to reduce its height to such an extent that the fourth film mask pattern 41 is left (FIG. 3C), step (10) of fluorine base dry etching, with the fourth mask pattern 41 made etching mask, a portion of the third film mask pattern 31 which is not covered with the fourth film mask pattern 41, to newly form a third film mask pattern 31 (i.e., third film outer frame pattern 3F) and with the second film mask pattern 21 made etching mask, a portion of the first film 1 which is not covered with the second mask pattern 21, to form a first film photomask pattern 1P (i.e., halftone phase shift film pattern) (FIG. 3D), and step (11) of chlorine base dry etching to remove the fourth mask pattern 41 completely and to remove a portion of the second film 2 which is not covered with the third film mask pattern 31 (third film outer frame pattern 3F), to newly form a second film mask pattern 21 (second film outer frame pattern 2F) (FIG. 3E).

Figure 3C:
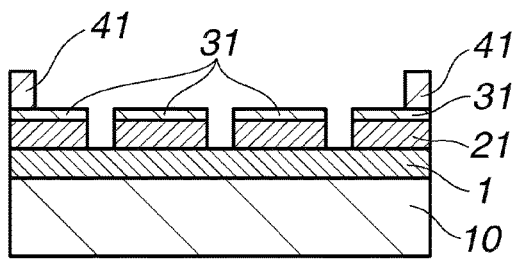
Figure 4A:
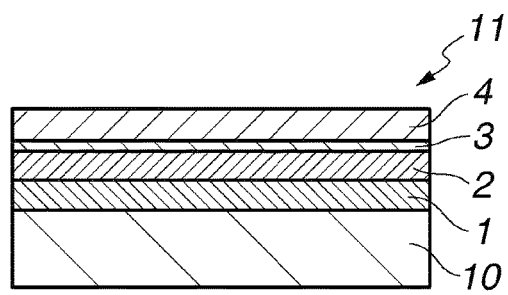
FIGS. 4A to 4F illustrate in cross-sectional view successive steps of another exemplary method (II) for preparing a halftone phase shift photomask from a halftone phase shift photomask blank of the invention.
Figure 4D:
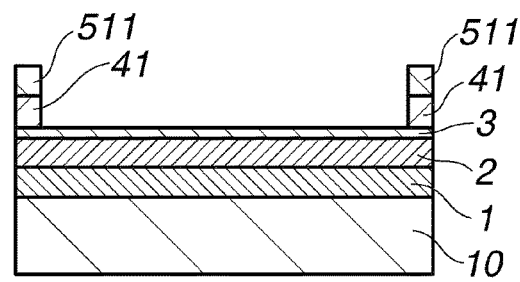
Figure 4B:
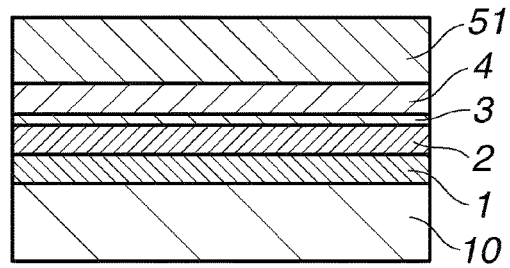
Figure 4E:
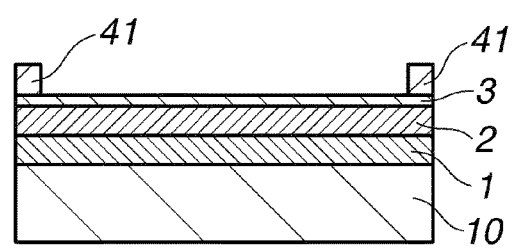
Figure 4C:
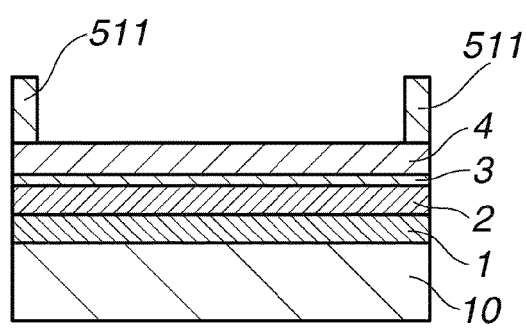
Figure 4F:
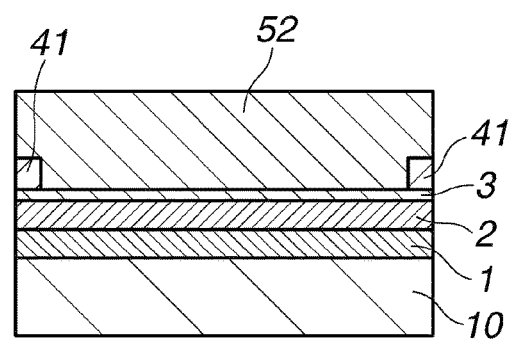

If the second resist pattern 521 is left after any step from step (8) to step (11), the method (I) may include step (12) of removing the second resist pattern 521 after any of steps (8) to (10), preferably between steps (8) and (9). Although FIGS. 3B, 3C and 3D show that the second resist pattern 521 is absent, the second resist pattern 521 may be left at these steps. The state of FIGS. 3B, 3C and 3D that the second resist pattern 521 is absent may be reached as a result of removing step (12). Alternatively, as the thickness of the second resist pattern 521 is gradually reduced by chlorine and fluorine base dry etching steps, the second resist pattern 521 is eventually removed. The method (I) is advantageously applied when the etching clear time of the fourth film is longer than the etching clear time of the second film. In this case, the second film may be a film which is thin, but does not vanish only during step (8) of fluorine base dry etching the third film. This is advantageous in that the thickness of the second resist film used in pattern formation in the mask pattern region can be set thinner.

In method (I), the thickness of the first resist film may be selected appropriate in the range that the first resist pattern is not vanished by chlorine base dry etching until the end of step (4); and the thickness of the second resist film may be selected appropriate in the range that the second resist pattern is not vanished by fluorine or chlorine base dry etching at least until the end of step (8). In either case, a thinner resist film is preferable.

Figure 5A:
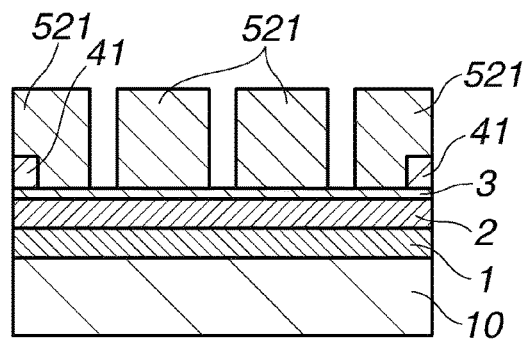
FIGS. 5A to 5E illustrate in cross-sectional view successive steps of method (II), following FIG. 4F.
Figure 5D:
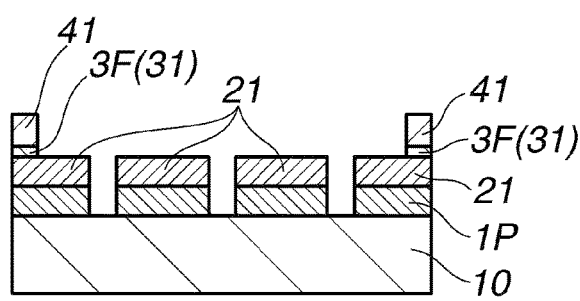
Figure 5B:
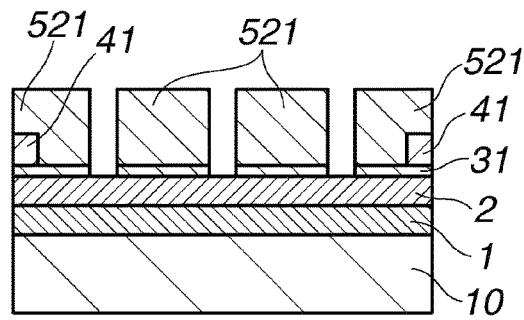
Figure 5E:
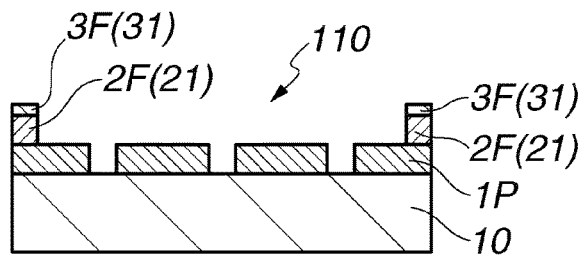

Also the halftone phase shift photomask 110 shown in FIG. 1B may be prepared by a method (II) comprising steps as shown in FIGS. 4 and 5, specifically step (1') of furnishing a halftone phase shift photomask blank 11 (FIG. 4A), step (2) of coating a first resist film 51 on the fourth film 4 (FIG. 4B), step (3) of processing the first resist film 51 to form a first resist pattern 511 in a portion where a mask pattern of the second film and a mask pattern of the third film are to be formed (FIG. 4C), step (4) of chlorine base dry etching, with the first resist pattern 511 made etching mask, a portion of the fourth film 4 which is not covered with the first resist pattern 511, to form a fourth film mask pattern 41 (FIG. 4D), step (5) of removing the first resist pattern 511 (FIG. 4E), step (6) of coating a second resist film 52 on the fourth film mask pattern 41 and the exposed portion of the third film 3 (FIG. 4F), step (7) of processing the second resist film 52 into a second resist pattern 521 in a portion where a photomask pattern is to be formed (FIG. 5A), step (8) of fluorine base dry etching, with the second resist pattern 521 made etching mask, a portion of the third film 3 which is not covered with the second resist pattern 521, to form a third film mask pattern 31 (FIG. 5B), step (9') of chlorine base dry etching, with the second resist pattern 521 and the third film mask pattern 31 made etching mask, the second resist pattern 521 and a portion of the second film 2 which is not covered with the third mask pattern 31, to form a second film mask pattern 21 (FIG. 5C), step (10) of fluorine base dry etching, with the fourth mask pattern 41 made etching mask, a portion of the third film mask pattern 31 which is not covered with the fourth film mask pattern 41, to newly form a third film mask pattern 31 (i.e., third film outer frame pattern 3F) and with the second film mask pattern 21 made etching mask, a portion of the first film 1 which is not covered with the second mask pattern 21, to form a first film photomask pattern 1P (i.e., halftone phase shift film pattern) (FIG. 5D), and step (11) of chlorine base dry etching to remove the fourth mask pattern 41 completely and to remove a portion of the second film mask pattern 21 which is not covered with the third film mask pattern 31 (third film outer frame pattern 3F), to newly form a second film mask pattern 21 (second film outer frame pattern 2F) (FIG. 5E).

Figure 5C:
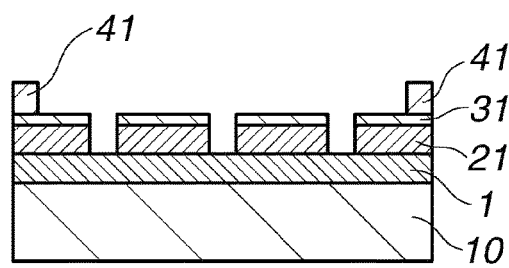
Figure 6A:
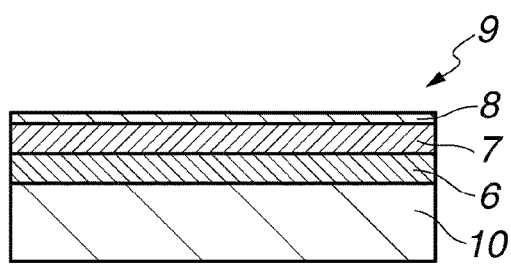
FIGS. 6A to 6F illustrate in cross-sectional view successive steps of a prior art method for preparing a photomask from a prior art photomask blank.
Figure 6B:
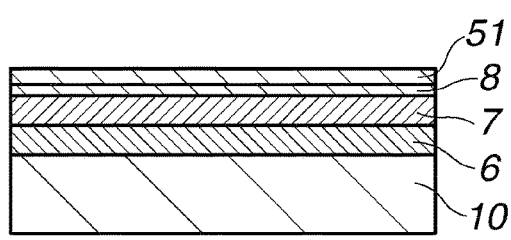
Figure 6C:
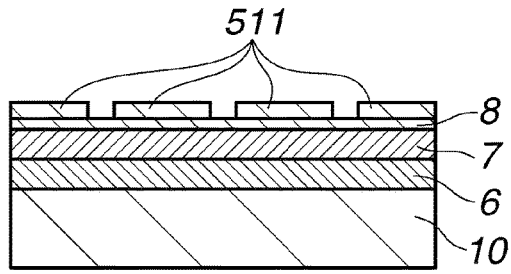
Figure 6D:
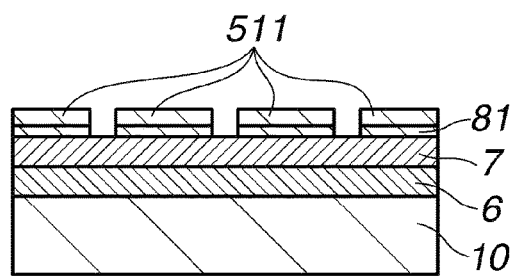
Figure 6E:
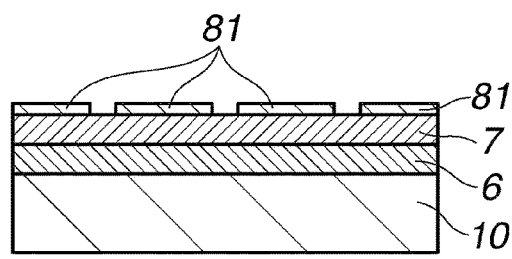
Figure 6F:
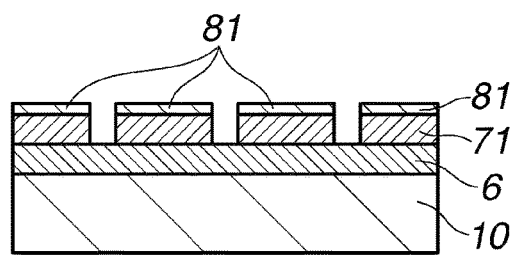
Figure 7A:
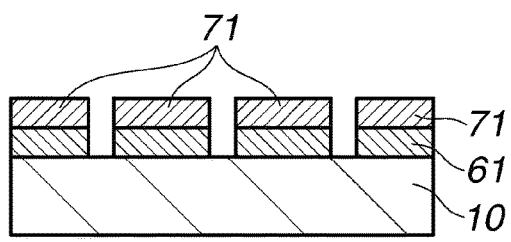
FIGS. 7A to 7E illustrate in cross-sectional view successive steps of the prior art method, following FIG. 6F.
Figure 7D:
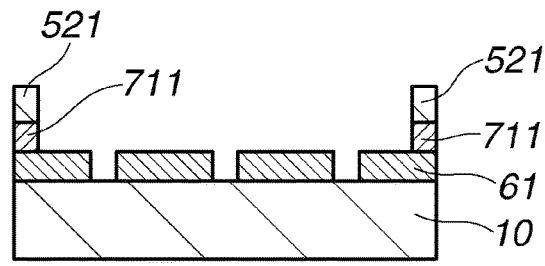
Figure 7B:
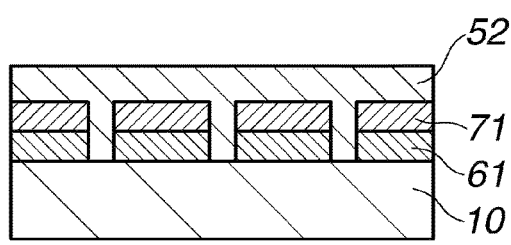
Figure 7E:
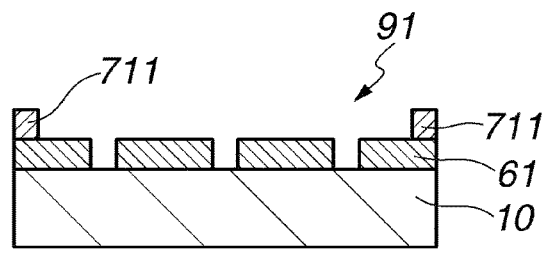
Figure 7C:
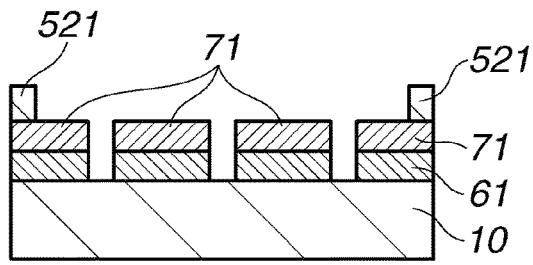

If the second resist pattern 521 is left after any step from step (9') to step (11), the method (II) may include step (12) of removing the second resist pattern 521 after any of steps (9') to (10), preferably between steps (9') and (10). Although FIGS. 5C and 5D show that the second resist pattern 521 is absent, the second resist pattern 521 may be left at these steps. The state of FIGS. 5C and 5D that the second resist pattern 521 is absent may be reached as a result of removing step (12). Alternatively, as the thickness of the second resist pattern 521 is gradually reduced by chlorine and fluorine base dry etching steps, the second resist pattern 521 is eventually removed. Although method (II) requires that the second resist film be thicker than in method (I), method (II) is successful in preparing the halftone phase shift photomask through equivalent steps to method (I) even when the etching clear time of the fourth film is equal to or shorter than the etching clear time of the second film.

In method (II), the thickness of the first resist film may be selected appropriate in the range that the first resist pattern is not vanished by chlorine base dry etching until the end of step (4); and the thickness of the second resist film may be selected appropriate in the range that the second resist pattern is not vanished by fluorine or chlorine base dry etching at least until the end of step (9'). In either case, a thinner resist film is preferable.

In the halftone phase shift photomask of the invention, as a result of removal of the fourth film, the surface of the third film is exposed, and the surface of the second film is not exposed. The first, second and third films provide necessary light shielding in the outer frame region and a portion of the photomask pattern region having light shielding property. For example, when the transparent substrate is a 6025 substrate (6×6×0.25 inch or 152×152×6.35 mm), the outer frame pattern may be formed in an arbitrary range extending inward from the four sides of the film-forming surface, and a region inside the outer frame pattern-forming region become a photomask pattern-forming region.

In a photolithographic process for forming a pattern with a half pitch of up to 50 nm, typically up to 30 nm, more typically up to 20 nm, especially up to 10 nm in a processable substrate, comprising the steps of forming a photoresist film on the processable substrate and exposing the photoresist film to light of wavelength up to 250 nm, preferably up to 200 nm, typically ArF excimer laser (193 nm) or $F_2$ laser (157 nm), through a patterned mask for transferring the pattern to the photoresist film, the halftone phase shift photomask of the invention is best suited for use in the exposure step.

The halftone phase shift photomask obtained from the photomask blank is advantageously applicable to the pattern forming process comprising projecting light to the photomask pattern including the pattern of halftone phase shift film for transferring the photomask pattern to an object (photoresist film) on the processable substrate. The irradiation of exposure light may be either dry exposure or immersion exposure. The halftone phase shift photomask of the invention is effective particularly when a wafer of at least 300 mm as the processable substrate is exposed to a photomask pattern of light by the immersion lithography with the tendency that a cumulative irradiation energy dose increases within a relatively short time in commercial scale microfabrication.

EXAMPLE

Examples are given below for further illustrating the invention although the invention is not limited thereto. All optical properties including phase shift, transmittance, and optical density are as measured with respect to ArF excimer laser light (193 nm).

Example 1

A halftone phase shift photomask blank as shown in FIG. 1A was prepared by using a DC sputtering system and successively depositing films on a 6025 quartz substrate. Namely, a MoSiON film of 75 nm thick which was a halftone phase shift film having a phase shift of 177°, a transmittance of 6% and an optical density of 1.22 was deposited on the substrate as a first film; a CrON film of 44 nm thick which was a light shielding film having a sheet resistance of 420Ω/□ and an optical density of 1.82 was deposited thereon as a second film; a SiO film of 10 nm thick which was a hard mask film having an optical density of 0.47 was deposited thereon as a third film; and a CrN film of 60 nm thick was deposited thereon as a fourth film. The first, second and third films had a total optical density of 3.51. The second film had an etching clear time of 125 seconds, and the fourth film had an etching clear time of 255 seconds, both on chlorine base dry etching under the same etching conditions.

From the halftone phase shift photomask blank, a halftone phase shift photomask as shown in FIG. 1B was prepared by the method (I) described above. The first resist film had such a thickness that the first resist pattern might not be vanished by chlorine base dry etching until the end of step (4). The second resist film had such a thickness that the second resist pattern might not be vanished by fluorine base dry etching until the end of step (8). The second resist film was removed after the completion of step (8) and prior to step (9). This resulted in a halftone phase shift photomask in which the fourth film was not left at all.

Example 2

A halftone phase shift photomask blank as shown in FIG. 1A was prepared by using a DC sputtering system, and successively depositing films on a 6025 quartz substrate. Namely, a SiN film of 65 nm thick which was a halftone phase shift film having a phase shift of 179°, a transmittance of 6% and an optical density of 1.22 was deposited on the substrate as a first film; a CrON film of 44 nm thick which was a light shielding film having a sheet resistance of 420Ω/□ and an optical density of 1.82 was deposited thereon as a second film; a SiO film of 10 nm thick which was a hard mask film having an optical density of 0.47 was deposited thereon as a third film; and a CrN film of 60 nm thick was deposited thereon as a fourth film. The first, second and third films had a total optical density of 3.51. The second film had an etching clear time of 125 seconds, and the fourth film had an etching clear time of 255 seconds, both on chlorine base dry etching under the same etching conditions.

From the halftone phase shift photomask blank, a halftone phase shift photomask as shown in FIG. 1B was prepared by the method (I). The first resist film had such a thickness that the first resist pattern might not be vanished by chlorine base dry etching until the end of step (4). The second resist film had such a thickness that the second resist pattern might not be vanished by fluorine base dry etching until the end of step (8). The second resist film was removed after the completion of step (8) and prior to step (9). This resulted in a halftone phase shift photomask in which the fourth film was not left at all.

Example 3

A halftone phase shift photomask blank as shown in FIG. 1A was prepared by using a DC sputtering system, and successively depositing films on a 6025 quartz substrate. Namely, a MoSiN film of 64 nm thick which was a halftone phase shift film having a phase shift of 179°, a transmittance of 6% and an optical density of 1.22 was deposited on the substrate as a first film; a CrON film of 44 nm thick which was a light shielding film having a sheet resistance of 420Ω/□ and an optical density of 1.82 was deposited thereon as a second film; a SiO film of 10 nm thick which was a hard mask film having an optical density of 0.47 was deposited thereon as a third film; and a CrN film of 60 nm thick was deposited thereon as a fourth film. The first, second and third films had a total optical density of 3.51. The second film had an etching clear time of 125 seconds, and the fourth film had an etching clear time of 255 seconds, both on chlorine base dry etching under the same etching conditions.

From the halftone phase shift photomask blank, a halftone phase shift photomask as shown in FIG. 1B was prepared by the method (I). The first resist film had such a thickness that the first resist pattern might not be vanished by chlorine base dry etching until the end of step (4). The second resist film had such a thickness that the second resist pattern might not be vanished by fluorine base dry etching until the end of step (8). The second resist film was removed after the completion of step (8) and prior to step (9). This resulted in a halftone phase shift photomask in which the fourth film was not left at all.

Example 4

A halftone phase shift photomask blank as shown in FIG. 1A was prepared by using a DC sputtering system, and successively depositing films on a 6025 quartz substrate. Namely, a MoSiON film of 75 nm thick which was a halftone phase shift film having a phase shift of 177°, a transmittance of 6% and an optical density of 1.22 was deposited on the substrate as a first film; a CrON film of 44 nm thick which was a light shielding film having a sheet resistance of 420Ω/□ and an, optical density of 1.82 was deposited thereon as a second film; a SiO film of 10 nm thick which was a hard mask film having an optical density of 0.47 was deposited thereon as a third film; and a CrN film of 20 nm thick was deposited thereon as a fourth film. The first, second and third films had a total optical density of 3.51. The second film had an etching clear time of 125 seconds, and the fourth film had an etching clear time of 85 seconds, both on chlorine base dry etching under the same etching conditions.

From the halftone phase shift photomask blank, a halftone phase shift photomask as shown in FIG. 1B was prepared by the method (II) described above. The first resist film had such a thickness that the first resist pattern might not be vanished by chlorine base dry etching until the end of step (4). The second resist film had such a thickness that the second resist pattern might not be vanished by fluorine base dry etching until the end of step (9'). The second resist film was removed after the completion of step (9') and prior to step (10). This resulted in a halftone phase shift photomask in which the fourth film was not left at all.

Japanese Patent Application No. 2017-046066 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A halftone phase shift photomask blank comprising a transparent substrate, a first film serving as a halftone phase shift film on the substrate, a second film serving as a light shielding film formed contiguous to the first film, a third film serving as a hard mask film formed contiguous to the second film, and a fourth film formed contiguous to the third film, wherein
   the first and third films are formed of silicon-containing materials which are resistant to chlorine base dry etching and removable by fluorine base dry etching,
   the second and fourth films are formed of silicon-free, chromium-containing materials which are resistant to fluorine base dry etching and removable by chlorine base dry etching, and
   the fourth film has a thickness of 60 to 120 nm.

2. The photomask blank of claim 1 wherein the second film has a sheet resistance of up to 10,000 Ω/□.

3. The photomask blank of claim 1 wherein the third film has a thickness of 1 to 20 nm.

4. The photomask blank of claim 1 wherein the third film is thinner than the second film.

5. The photomask blank of claim 1 wherein the first, second and third films have a total optical density of at least 2 relative to exposure light.

6. The photomask blank of claim 1 wherein the second and fourth films are constructed such that an etching clear time of the fourth film on chlorine base dry etching under one set of conditions is longer than an etching clear time of the second film on chlorine base dry etching under said one set of conditions.

* * * * *